United States Patent [19]

Finger et al.

[11] 4,193,026
[45] Mar. 11, 1980

[54] METHOD AND APPARATUS FOR MEASURING THE STATE OF CHARGE OF A BATTERY BY MONITORING REDUCTIONS IN VOLTAGE

[75] Inventors: Eugene P. Finger, Brewster; Eugene A. Sands, Scarsdale, both of N.Y.

[73] Assignee: Curtis Instruments, Inc., Mount Kisco, N.Y.

[21] Appl. No.: 936,725

[22] Filed: Aug. 25, 1978

Related U.S. Application Data

[63] Continuation of Ser. No. 678,128, Apr. 18, 1976, abandoned, which is a continuation-in-part of Ser. No. 591,055, Jun. 27, 1975, Pat. No. 4,017,724, and Ser. No. 538,463, Jun. 14, 1975, abandoned.

[51] Int. Cl.² .......................................... G01N 27/42
[52] U.S. Cl. .................................. 324/428; 340/347 R
[58] Field of Search ............... 324/29, 99 R, 29.5, 324/99 D, 30 R, 77 A, 182, 103 R, 120, 140 R; 320/39, 40, 43, 45, 24, 9, 47, 48; 340/249, 248 A, 248 B, 253 C, 347 D; 307/362; 235/92 CA, 92 EL, 92 T, 92 NT

[56] References Cited

U.S. PATENT DOCUMENTS

3,286,253  11/1966  Leng .................................... 340/347

FOREIGN PATENT DOCUMENTS

1207394   9/1970  United Kingdom ................. 324/29.5
1247986   9/1971  United Kingdom ................. 324/104
1262016   2/1972  United Kingdom ................. 324/29.5
1335072  10/1973  United Kingdom ................. 324/102

Primary Examiner—M. Tokar
Attorney, Agent, or Firm—Pennie and Edmonds

[57] ABSTRACT

A method and apparatus are disclosed for measuring the state of charge of a battery. The apparatus comprises threshold means for sensing reductions below a threshold level in the output terminal voltage of the battery and for producing a signal in response thereto and means for integrating said signal over a plurality of such reductions. The output of the integrating means is indicative of the state of charge of the battery. In a preferred embodiment the signal comprises a series of pulses whose number is proportional to the time that the terminal voltage is below the threshold value and the integrating means counts such pulses. Alternatively, a single pulse may be produced and counted for each time the output terminal voltage is reduced below the threshold level. In another embodiment, the signal from the threshold means is integrated directly to develop a representation of the state of charge of the battery. Circuits are also disclosed using a plurality of threshold means connected in series or in parallel.

129 Claims, 7 Drawing Figures

METHOD AND APPARATUS FOR MEASURING THE STATE OF CHARGE OF A BATTERY BY MONITORING REDUCTIONS IN VOLTAGE

CROSS REFERENCE TO OTHER APPLICATIONS

This is a continuation of application Ser. No. 678,128, Apr. 18, 1976 now abandoned. Application Ser. No. 678,128 is a continuation-in-part of application Ser. No. 591,055 now U.S. Pat. No. 4,017,724 entitled "Apparatus for Measuring Battery Depletion by Monitoring Reductions in Voltage" and application Ser. No. 538,463 now abandonded entitled "System for Measuring Battery Depletion by Monitoring Voltage".

BACKGROUND AND SUMMARY OF THE INVENTION

This invention is directed to a system particularly useful for measuring and indicating the state of charge of a storage battery. The invention is especially useful for monitoring rechargeable storage batteries such as those used in battery powered vehicles which may include various battery powered tools, such as fork lifts or the like, and it will be described in detail in this context. However, the inventive system may be used with any battery powered system using rechargeable or non-rechargeable batteries.

Circuitry is provided for integrating a signal related to fluctuations in the battery terminal voltage and for displaying the state of charge of the battery in terms of percentage charge remaining in the battery. The display is similar to a display showing the fuel remaining in a conventional gasoline powered vehicle and is therefore quite easy for an operator familar only with gasoline powered vehicles to read and understand. The system may also be provided with a deep discharge detector which, when the remaining charge in the battery has been depleted below a predetermined level, disables the various tools on the vehicle, leaving only those systems that are essential for the operator to be able to return to a battery charging station.

The system may be fabricated using any device which is capable of measuring and indicating the integral of an electrical signal. Such devices include, for example, electronic devices such as counters, electro-mechanical devices such as stepper motors, and electrochemical devices such as coulometers, and the inventive system will be described in circuits employing some such devices. It is, however, contemplated that the inventive system may be used advantageously with any integrating device.

In the preferred embodiment, connection of the battery to the vehicle results in the actuation of a threshold circuit which detects whether the voltage present at the terminals of the battery is above an upper threshold value. Insofar as a newly charged battery has an output voltage which is significantly higher than the nominal terminal voltage, the upper threshold value is picked to be about 10 percent above the nominal terminal voltage. If this threshold voltage is detected by the circuit, it is likely that the battery is freshly charged; and the threshold circuit causes the state of charge monitoring circuitry to produce an indication the battery is fully charged.

As the battery is used, varying load conditions placed across the battery cause the voltage to be reduced. In the preferred embodiment, the magnitude and duration of each of these voltage reduction is monitored by a second threshold circuit which produces an output whenever the terminal voltage falls below a lower threshold value. The output of this threshold circuit is connected to circuitry which generates a train of pulses in response to reductions in voltage. The number of pulses generated is a function of the time during which the terminal voltage is below the lower threshold voltage. Illustratively, the pulse generating circuitry takes the form of either a voltage controlled oscillator or a relaxation oscillator.

The pulse generating circuitry is in turn connected to integrating means, preferably an electronic counter, for counting the pulses and accumulating the count, thus generating an integral which is proportional to the total time that the terminal voltage is below the lower threshold voltage. In typical operation, this integration is performed over a hundred or more separate cycles in which the battery terminal voltage falls below the lower threshold level and then recovers to a level greater than said threshold.

The output of the integrating means furnishes an indication of the state of charge. This indication is more accurate than prior art devices since the integrating means accumulates the count for each time the terminal voltage falls below the lower threshold value. The output of the electronic counter may conveniently be read by converting it to an analogue signal which is used to drive a conventional d' Arsonval electric meter. The output of the integrating means may also activate an alarm which warns the operator that the state of charge of his vehicle's battery is at a predetermined low state of charge and, at a lower level of charge, may disable auxiliary functions on the vehicle such as the fork lift, thereby forcing the operator to return to the base station for a fresh battery.

Alternatively, the integrating means can be used with a threshold circuit that produces a single pulse each time the battery terminal voltage falls below the lower threshold level. Although not as accurate as the preferred embodiment, accumulation of said pulses over several such reductions below threshold is a crude measure of the state of charge of the battery.

Other alternatives include the use of a plurality of threshold means connected in series to produce a signal, for example, only when the battery terminal voltage falls below a threshold level and remains below such level for a specified period of time.

In another embodiment the output of the threshold circuit is integrated directly by a suitable integrator such as a coulometer. Illustratively, the magnitude and duration of voltage reductions caused by varying load conditions placed across the battery are monitored by a multiple-threshold circuit whose output signal is related to the magnitude and duration of the voltage reductions. This signal is stored by a integrator which drives a display and may also activate an alarm as in the first embodiment. Again, the output of the integrator furnishes an indication of the state of charge.

BRIEF DESCRIPTION OF THE DRAWINGS

These and other objects, features and elements of the invention will be more readily apparent from the following detailed description of the invention in which.

DETAILED DESCRIPTION OF THE PREFERRED EMBODIMENTS

For convenience the invention will be described in a number of illustrative embodiments particularly useful for measuring the state of charge of rechargeable batteries in a battery powered vehicle. However, it is noted that the invention may be applied to any battery powered system whether the system employs rechargeable or nonrechargeable batteries.

Figure 1:
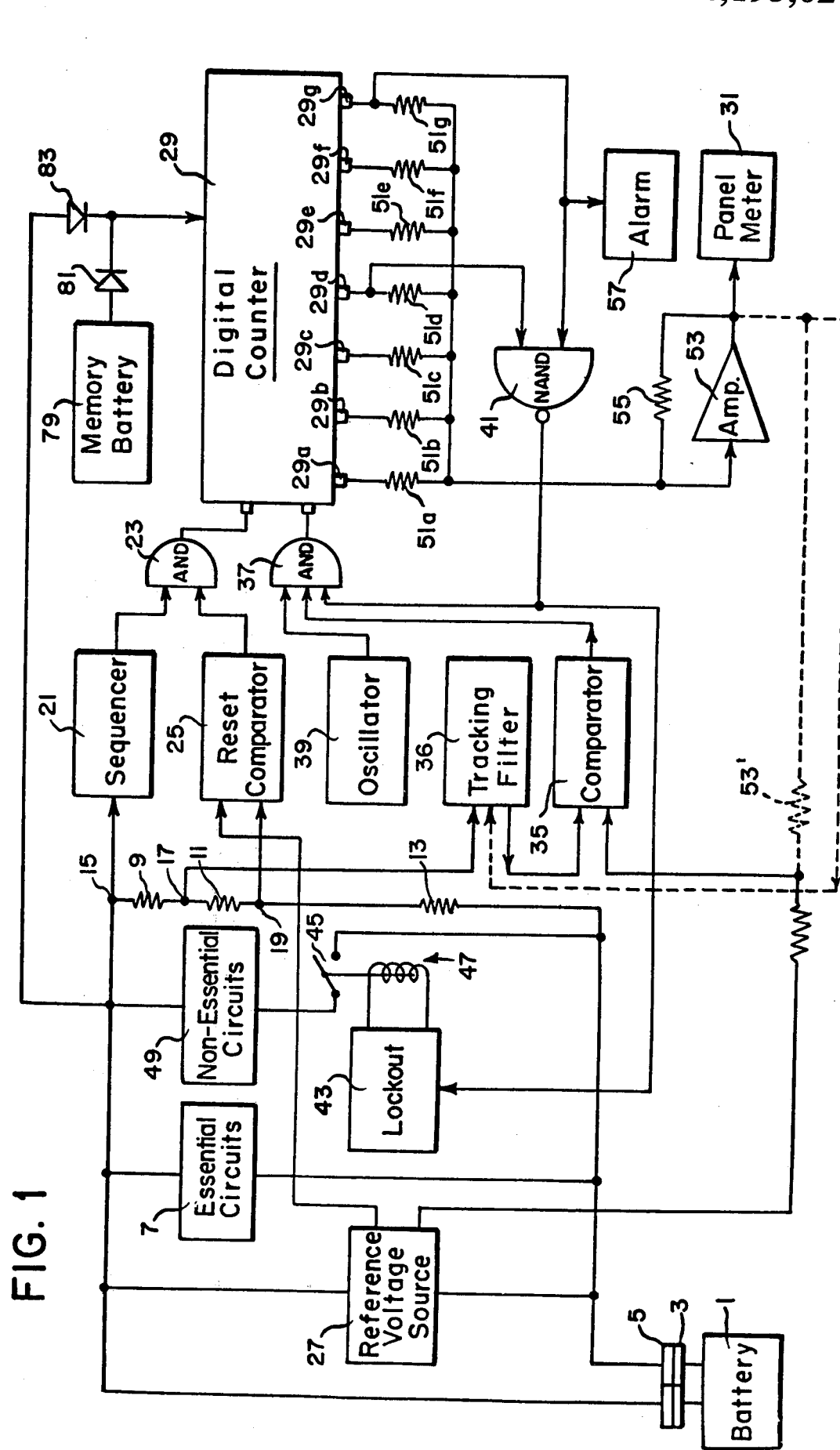
FIG. 1 is a schematic illustration in block diagram form of the power system of a batter powered vehicle incorporating an illustrative control system for monitoring the state of charge of the battery.

Turning first to FIG. 1, power is supplied to the system by a battery 1 via mating connectors 3 and 5. Connection of the battery to the system couples power to the essential circuits 7 in the system which include all the electrical subsystems in the vehicle that are not to be disabled in response to the detection of a depleted state of charge in the battery. Connection of the battery to the system also results in the application of the battery terminal voltage to voltage-dividing resistors 9, 11 and 13 with the result that the magnitudes of the voltages at points 15, 17 and 19 are functions of the magnitude of the voltage present at the output terminals of battery 1. The appearance of a voltage at point 15 results in the application of that voltage to sequencer 21. In response, the sequencer produces a logical "0" output which is coupled to an AND gate 23 causing it to be disabled and producing a logical "0" output. AND gate 23 is disabled in order to make it unresponsive to any transients which may pass through the state of charge detecting circuitry via connectors 3 and 5. After a fixed period of time which may be typically on the order of one second, or as long as is necessary for all transients to subside, the output of the sequencer becomes logical "1".

The voltage at point 19 is coupled to a reset comparator 25 which compares it with a reference voltage source 27 powered by battery 1. Reference voltage source 27 may be any of a number of known circuits which provide constant voltages as outputs even though they may be powered by a source which varies within certain limits. Such circuits are well known and may typically comprise Zener diode regulated voltage sources or the like.

For batteries of the lead acid variety, the voltage sent by reference voltage source 27 to comparator 25 is selected to be equal in magnitude to the voltage present a point 19 when the output terminal voltage of battery 1 is on the order of 10% higher than the nominal terminal voltage of the battery. This 10% figure is selected because, for lead acid batteries, the terminal voltage of the battery when it is fully charged is usually about 10% higher than its nominal terminal voltage. Thus, if the output terminal voltage of the battery is about 10% higher than its nominal terminal voltage, comparator 25 will detect this condition by comparing the voltage at point 19 to the voltage coupled to the comparator by source 27 and will produce a logical "1" output for a fixed period of time on the order of four seconds, after which the output returns to logical "0". It has been empirically shown that this technique is generally quite reliable. Of course, the particular value of reference terminal voltage that is used varies as a function of the nominal terminal voltage of the battery and the battery type.

The logical "1" output of comparator 25 drives one of the inputs of AND gate 23. The other input of AND gate 23 is driven by sequencer 21. As noted above, the sequencer changes its output from logical "0" to logical "1" after transients in the system have subsided. The presence at the input of AND gate 23 of the logical "1" output of comparator 25, which indicates that the battery is fully charged, and the logical "1" output of sequencer 21, which indicates that transients have subsided, causes the output of AND gate 23 to produce a logical "1" output. This logical "1" output is coupled to and drives the "clear" input of a counter 29, thereby clearing any signal that may be in the counter. Outputs 29a–g of counter 29 have two digital states "0" and "1" and display the output of counter 29 in binary code with output 29a being the least significant output digit and output 29g the most significant. When the counter is cleared, all of its outputs 29a–g are logical "0", indicating that the battery is fully charged. In a commercial embodiment of the invention counter 29 has 14 binary stages and 7 outputs from the seven most significant bits.

Outputs 29d and 29g are coupled to a NAND gate 41 whose output drives lockout circuit 43. The two logical "0"s at the input of NAND gate cause it to have a logical "1" output. This logical "1" output causes lockout circuit 43 to close the contacts 45 of a relay 47 and couples power to the nonessential electrical circuits 49, such as the power lift of an electrical truck. Since output 29g is the most significant output, it will not change to a "1" output until half the total capacity of counter 29 is counted. When this happens, the logical "1" will actuate an alarm 57, notifying the operator. The output of NAND gate 41 will not change until more than half the total capacity of counter 29 has been counted when a digital value which includes a logical "1" at outputs 29d and 29g is first reached. At this time, lockout circuit 43 will open contacts 45, which will remain open, thereby disabling nonessential circuits 49. The operator of the vehicle is thus forced to return to the charging station because the nonessential task performing circuits such as the power lift of the vehicle are disabled while essential circuits such as the traction motor are still operable. As will be evident, the point at which lockout circuit 43 is activated can be modified simply by selecting the appropriate output leads 29a–g to control NAND gate 41.

It has been found experimentally that the sum of the time that the magnitude of the battery terminal voltage is below a threshold level is a measure of the state of charge of the battery. Thus, as the battery is used, a picture of its state of charge can be continuously constructed by cumulatively storing the periods of time that the terminal voltage remains below a given threshold.

Reductions in the terminal voltage are detected by a tracking comparator 35 which compares the voltage present at point 17 to a voltage provided to comparator 35 by reference voltage source 27. The voltage coupled by reference voltage source 27 to comparator 35 is selected to be approximately equal to the voltage at point 17 when the output terminal voltage of the battery is at the desired threshold. Typically, this threshold is set to be about 90% to 97% of the rated terminal voltage of a lead acid battery. Advantageously, the threshold voltage can be varied to accommodate differences in individual operating conditions. The voltage at point 17 is coupled to comparator 35 by a tracking filter 36 which prevents transients and other signals unrelated to depletion in the state of charge of the battery from being registered in the monitoring circuitry. Setting the response of filter 36 to eliminate transients faster than 10 milliseconds to 100 milliseconds has been found to give excellent results, as this effectively eliminates microsecond and millisecond transients which are not related to charge depletion.

AND gate 37, which is coupled to the clocking input of counter 29, is responsive to the output of tracking comparator 35, to a free-running oscillator 39 and to the output of NAND gate 41. Many different kinds of oscillators can be used. In one commercial embodiment of the invention used with a 14 stage digital counter to measure state of charge of lead acid batteries, oscillator 39 periodically produces a logical "1" pulse, at a pulse repetition rate of approximately 200 milliseconds.

When counter 29 is cleared by the pulse from AND gate 23 indicative of full charge, all of its outputs become logical "0", and outputs 29d and 29g cause NAND gate 41 to produce a logical "1" at its output. If there is then a drop in battery voltage below threshold, this drop will be detected by comparator 35 which will in turn apply a logical "1" to the input of AND gate 37. With the output of comparator 35 and NAND gate 41 logical "1", the periodic application of a logical "1" signal to AND gate 37 from oscillator 39 will result in the periodic application of a pulsed logical "1" signal from AND gate 37 to the clocking input of counter 29. This advances the count of the counter in direct proportion to the time that terminal voltage is below the threshold value. When the terminal voltage returns above threshold, the output of comparator 35 switches to a logical "0", thereby blocking AND gate 37 and terminating counting. The count is stored until the next time the terminal voltage falls below threshold, whereupon the output of comparator 35 again becomes a logical "1" and counting resumes where it left off. Counter 29 thus accumulates the number of pulses applied from gate 37, said number being approximately proportional to the total time that the terminal voltage has been below the threshold value. In typical usage, the terminal voltage will fall below the threshold value and return above it perhaps a hundred times before the count in counter 29 becomes high enough to trigger alarm 57.

The output of counter 29 is converted to an analogue signal by summing resistors 51a-g. Resistors 51a-g have successively lower values, each resistor having a value of resistance one half that of the previous resistor. Thus, resistor 51a has a value of R ohms, resistor 51b a value of R/2 ohms, resistor 51c a value of R/4 ohms and so forth. The current output from resistor 51b is thus twice the current output from resistor 51a, while the current output from resistor 51c is four times the output current from resistor 51a, etc. The outputs of the resistors are coupled together and sent to an inverting amplifier 53 which sums them. Because amplifier 53 is an inverting amplifier it has a maximum output when outputs 29a-g are all logical "0". This results in a full scale deflection of meter 31 which is gradually decreased to zero as pulses are stored in counter 29. Because these pulses are periodic and are only coupled from the oscillator during the time that the tracking comparator senses a voltage below threshold, the number of pulses stored is proportional to the total amount of time that tracking comparator 35 has detected a voltage below threshold. Thus, the display on panel meter 31 reveals the state of charge of the battery.

Depletion of the state of charge in a battery powered systems results in longer and deeper transient voltage reductions in response to transient load conditions. In may therefore be desirable to vary the threshold of comparator 35 in response to the integral stored in counter 29. Specifically, because of the increasing magnitude of voltage reductions with decreasing state of charge, it may be desirable to be able to lower the threshold value in response to a lower level of charge in the battery. This may be done by connecting a resistor 53' from the output of amplifier 53 to the input of tracking comparator 35, as is illustrated in phantom lines. Typically, the extent of the change in threshold is about 7.5% of rated terminal voltage for a lead acid battery.

The longer and deeper transients in output terminal voltage which occur in response to increasingly lower states of charge in a battery may also be compensated for by making the response of tracking filter 36 a function of the integral stored in counter 29. This may be done using the feedback path, shown in phantom lines in FIG. 1, extending between amplifier 53 and filter 36. Advantageously, the amount of feedback to comparator 35 or filter 36 can be varied, for example, by varying the resistance of resistor 53', to adjust for different operating conditions.

Under various circumstances, battery 1 may be disconnected from the system and then reconnected. In order to prevent counter 29 from losing the count stored in it, it is necessary to provide the system with a memory battery 79 which supplies power to counter 29 during the interval that the battery 1 is disconnected. Memory battery 79 is coupled to counter 29 by diode 81 which is biased into the nonconducting region by diode 83 when battery 1 is connected in the circuit.

Although the operation of comparator 35, AND gate 37 and oscillator 39 has been described in terms of gating the oscillator output in accordance with the output from the comparator, it will be recognized that the oscillator can be regarded as sampling the output of the comparator. Thus, whenever the output of NAND gate 41 is a logical "1", each logical "1" signal from oscillator 39 samples the output of comparator 35. When this output is a logical "1", this results in the application of a logical "1" pulse to the clocking input of counter 21. As will be evident, since oscillator 39 samples the output of comparator 35, no count will be registered if the battery terminal voltage is below threshold only in the time span between successive pulses from oscillator 39. However, since this time span will typically be only 200 milliseconds or less, the apparatus of FIG. 1 will usually register at least one count for each time the battery terminal voltage falls below the threshold value because of charge depletion.

Figure 2:
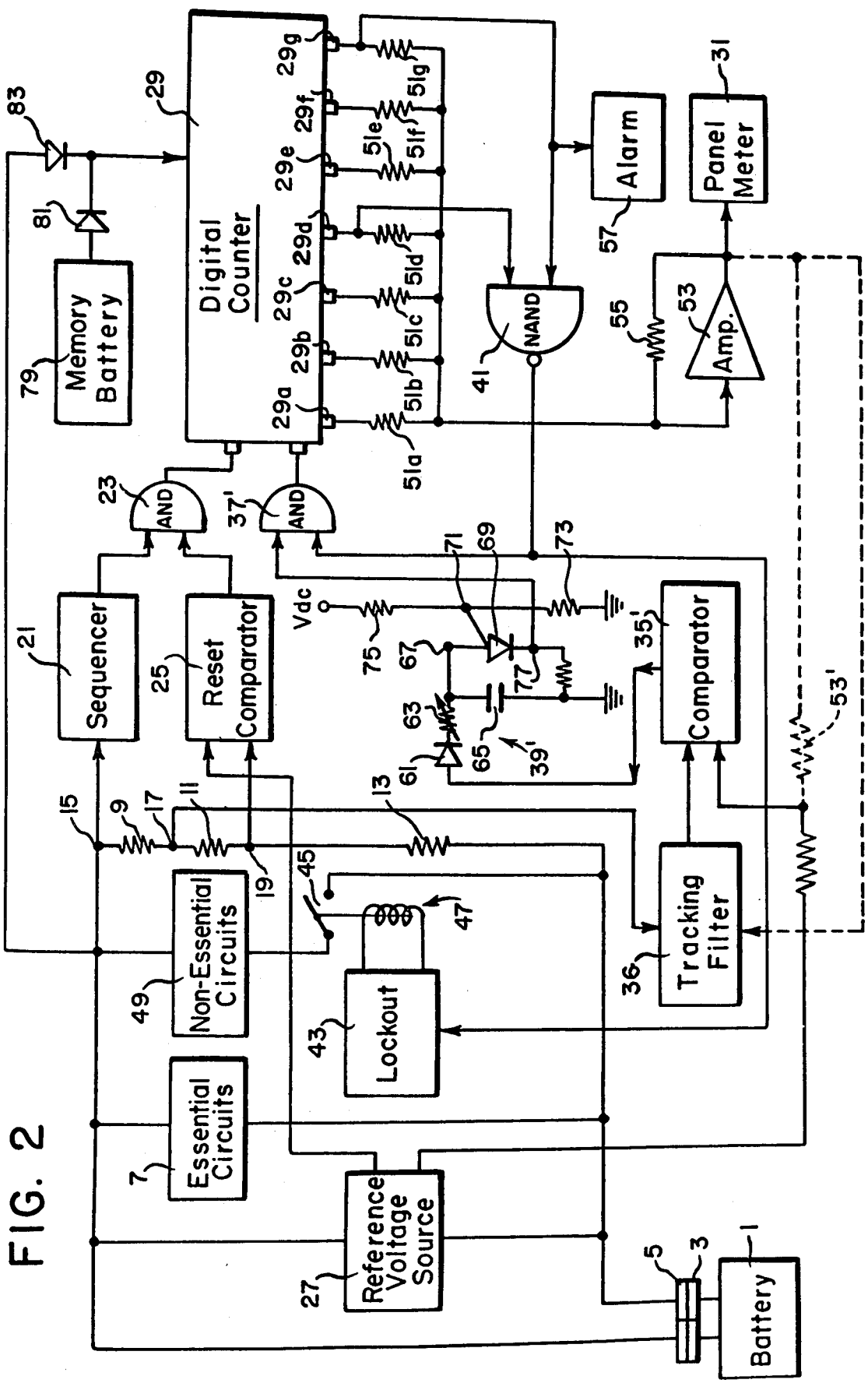
FIGS. 2 through 6 are schematic illustrations in block diagram form of alternative monitoring systems constructed in accordance with the present invention.

Referring to FIG. 2, the preferred embodiment of the apparatus of the present invention is illustrated. The operation of this system is largely identical to that of the system illustrated in FIG. 1. The primary difference is that oscillator 39 tracking comparator 35 and AND gate 37 have been replaced by tracking comparator 35', self-resetting integrator 39' and AND gate 37'. When a voltage below the threshold value is detected by comparator 35', it produces an output current which is fed via diode 61 and variable resistor 63 to capacitor 65. The voltage present across the capacitor is applied to terminal 67 of a unijunction transistor 69. Terminal 71 of the unijunction transistor is provided with a bias voltage by a voltage divider comprising resistors 73 and 75 which are connected to a source of DC power. Whenever the output of tracking comparator 35' becomes active, it sends current into capacitor 65, thereby raising the voltage at terminal 67. This voltage is stored in capacitor 65 after the tracking comparator returns to its unactivated state, and it resumes increasing as soon as tracking comparator 35' is again actuated.

When the voltage at terminal 67 becomes high enough, unijunction transistor 69 is driven into conduction, thereby producing an output at its terminal 77. This signal is coupled to AND gate 37' and, when NAND gate 41 is active, results in the passing of a pulse to counter 29 and advancement of the counter. During the course of completely discharging a battery, capacitor 65 is charged and discharged a great number of times with the resultant application of a pulse from terminal 77 and AND gate 37' every time the capacitor is discharged. It is thus seen that self-resetting integrator 39' produces a train of pulses in response to tracking comparator 35' in place of oscillator 39 of FIG. 1.

By varying the resistance of variable resistor 63, one can vary the pulse repetition rate of the output signal from terminal 77 of transistor 69. This, in turn, will vary the length of time it takes counter 29 to trigger alarm 57 and lockout circuit 43. Thus, by adjusting resistor 63, the response of the apparatus of FIG. 2 can be modified as necessary to reflect individual operating experience with the battery being monitored.

Figure 3:
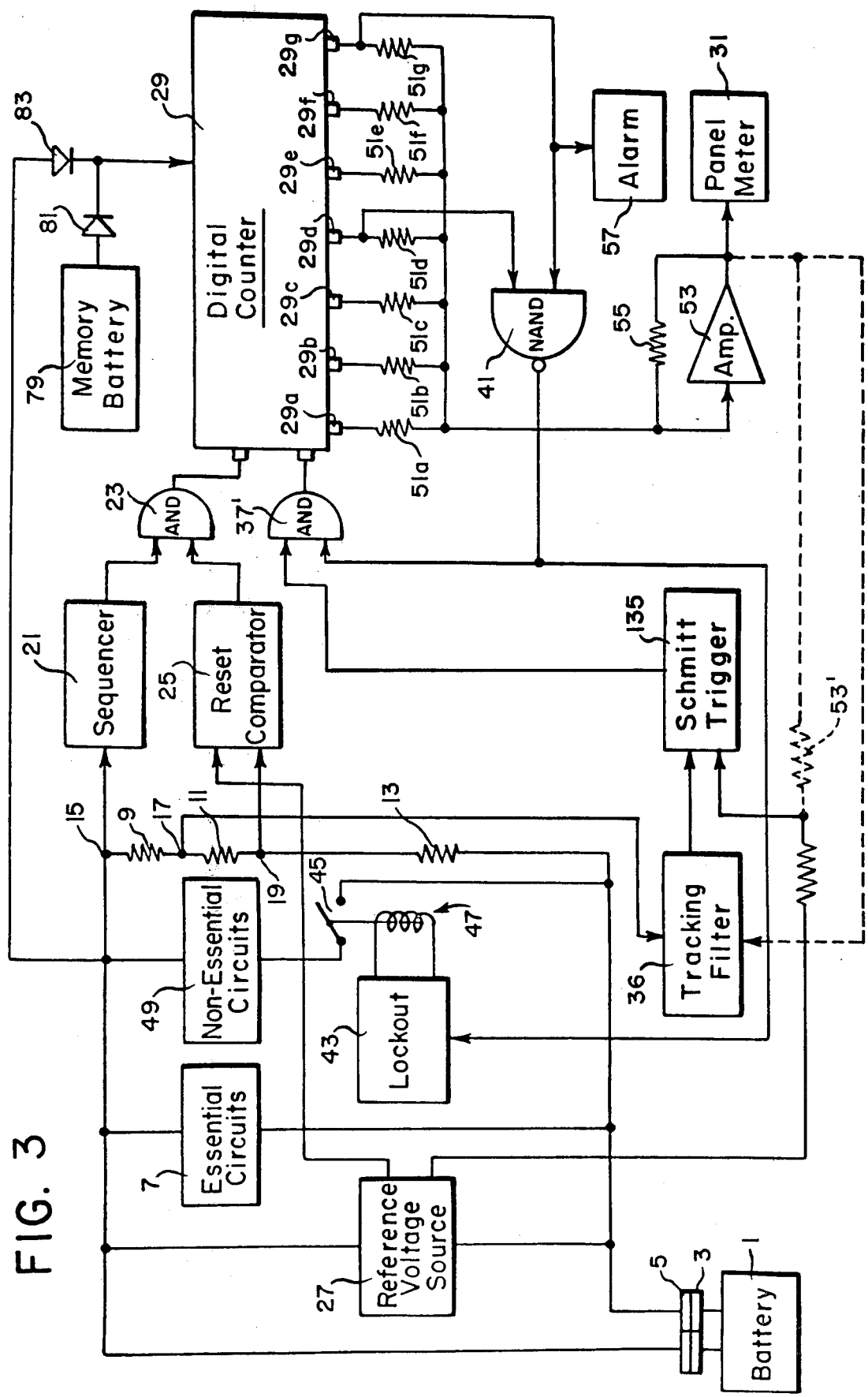

Another embodiment of the invention is illustrated in FIG. 3. The apparatus and the operation of this embodiment is substantially the same as that of FIG. 2 but a Schmitt trigger 135 has been substituted for comparator 35' and self-resetting integrator 39' has been eliminated. As is well known, a Schmitt trigger is a comparator which has hysteresis. Thus, in the context of the present invention Schmitt trigger 135 switches from a first output state to a second output state when the battery terminal voltage applied to it through tracking filter 36 falls below a threshold value. It remains in this output state until the battery terminal voltage rises above a second threshold level greater than the threshold level which switches the trigger from the first output state to the second state. The use of Schmitt trigger is preferred over that of an ordinary comparator to avoid erroneous counts due to noise when the battery terminal voltage is hovering near the threshold value. By requiring the voltage to return above a second threshold level, which is a fixed voltage above the first threshold level, spurious counts due to noise can be eliminated.

The output of Schmitt trigger 135 is applied directly to counter 29 through AND gate 37'. Illustratively, the counter registers a count upon detecting the rising edge of the Schmitt trigger output as it switches from its first output state to its second output state.

As will be apparent, this embodiment merely counts the number of times that the battery terminal voltage falls below a threshold level. The remainder of the circuit operates in the same fashion as that of FIG. 2 causing activation of an alarm and de-activation of non-essential circuits only after many counts have been accumulated.

Figure 4:
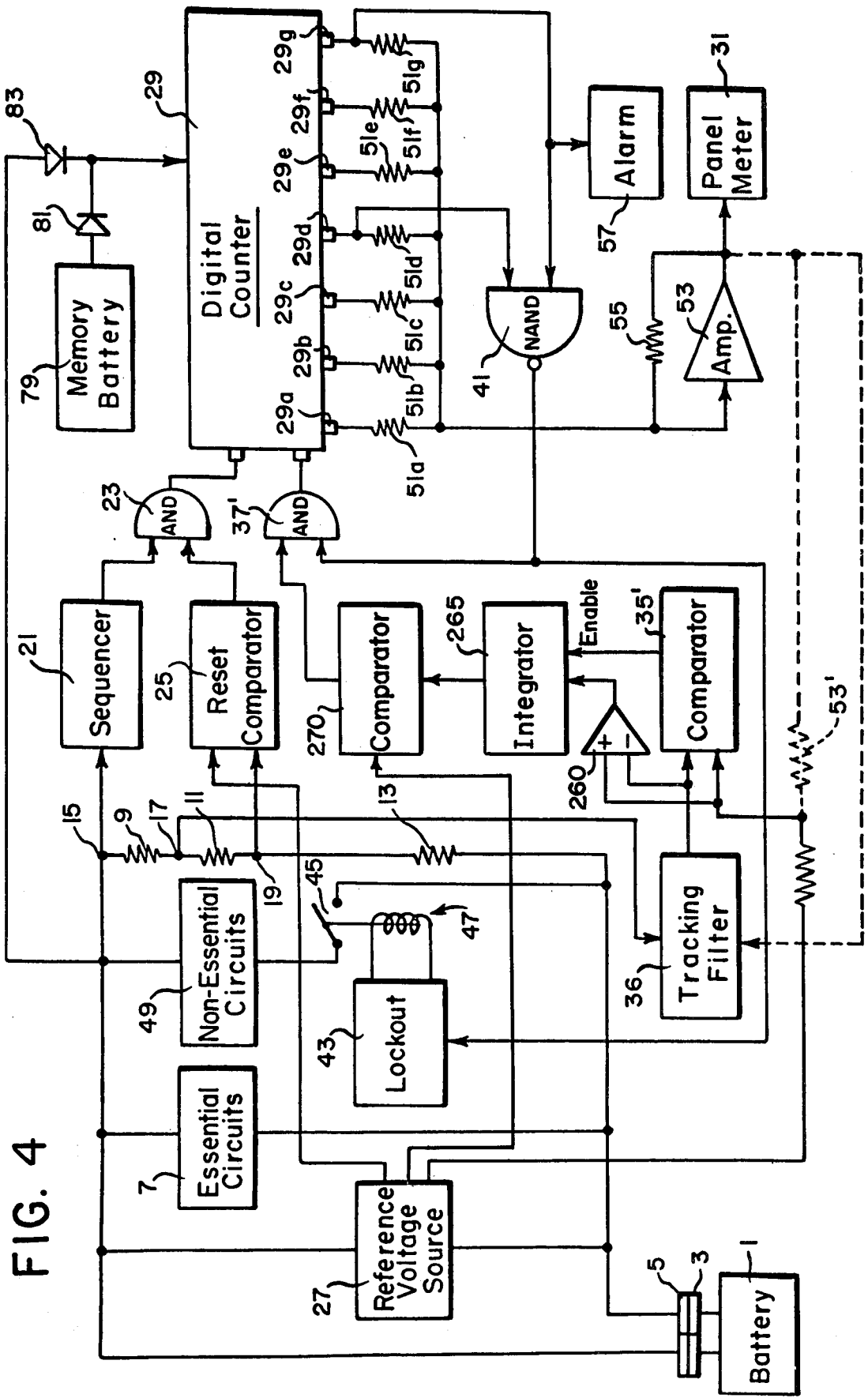

Still another embodiment of the invention is shown in FIG. 4. Here again the apparatus and its operation are similar to that illustrated in FIGS. 2 and 3. However, in this case what is counted is not voltage excursions below a threshold value but rather voltage excursions below a threshold value and having a severity in excess of another threshold value. This is accomplished by substituting a differential amplifier 260, an integrator 265 and a comparator 270 for self-resetting integrator 39' of FIG. 2.

As shown in FIG. 4 the output of tracking filter 36 is applied to comparator 35' and to differential amplifier 260. Comparator 35' and amplifier 260 compare the battery terminal voltage from filter 36 with the same reference voltage from source 27. The output of differential amplifier 260 is a signal proportional to the difference between the reference voltage and the battery terminal voltage. When the battery terminal voltage is greater than the reference voltage applied to comparator 35', the output of the comparator is a signal which disables integrator 265, which would otherwise integrate the output of differential amplifier 260. When the battery terminal voltage is less than the reference voltage, comparator 35' enables integrator 265. Illustratively, integrator 265 may be an integrating capacitor and associated circuitry similar, for example, to capacitor 65, diode 61, and variable resistor 63 of FIG. 2. Integrator 265 may be enabled, for example, by applying the appropriate signal from comparator 35' to an AND gate or by removing a short across the integrating capacitor or a short on the input signal applied from differential amplifier 260 to integrator 265. The output of the integrator is applied to comparator 270 and the output of comparator 270 is applied to AND Gate 37' and thence to the input to digital counter 29.

When the battery terminal voltage falls below the threshold voltage applied to comparator 35', integrator 265 is enabled by the signal from comparator 35' and begins to integrate the output signal from differential amplifier 260. The voltage accumulated in integrator 265 is compared with a reference voltage signal in comparator 270. When the capacitor voltage exceeds the reference voltage, comparator 270 switches from a first output state to a second output state. When AND Gate 37' is enabled, this results in the application of a signal to digital counter 29 which illustratively detects the rising edge produced by the change of output states and increments counter 29. The remainder of the circuit operates in the same fashion as that of FIG. 2.

If the battery terminal voltage returns above the reference voltage before the voltage stored by integrator 265 exceeds the reference voltage applied to comparator 270, the voltage stored by integrator 265 is reduced to an initial value. For example, comparator 35' may replace the short circuit and empty the charge stored in the integrating capacitor. Thus, the output signal is applied by comparator 270 to digital counter 29 only if the integral of the particular excursion of battery terminal voltage below threshold is sufficiently great to cause the voltage developed across integrator 265 to exceed the reference voltage applied to comparator 270. As will be evident, if an output signal is produced by comparator 270, this signal will be terminated when the battery terminal voltage rises above the reference voltage applied to comparator 35' and the voltage stored in integrator 265 is reduced to its initial value.

Figure 5:
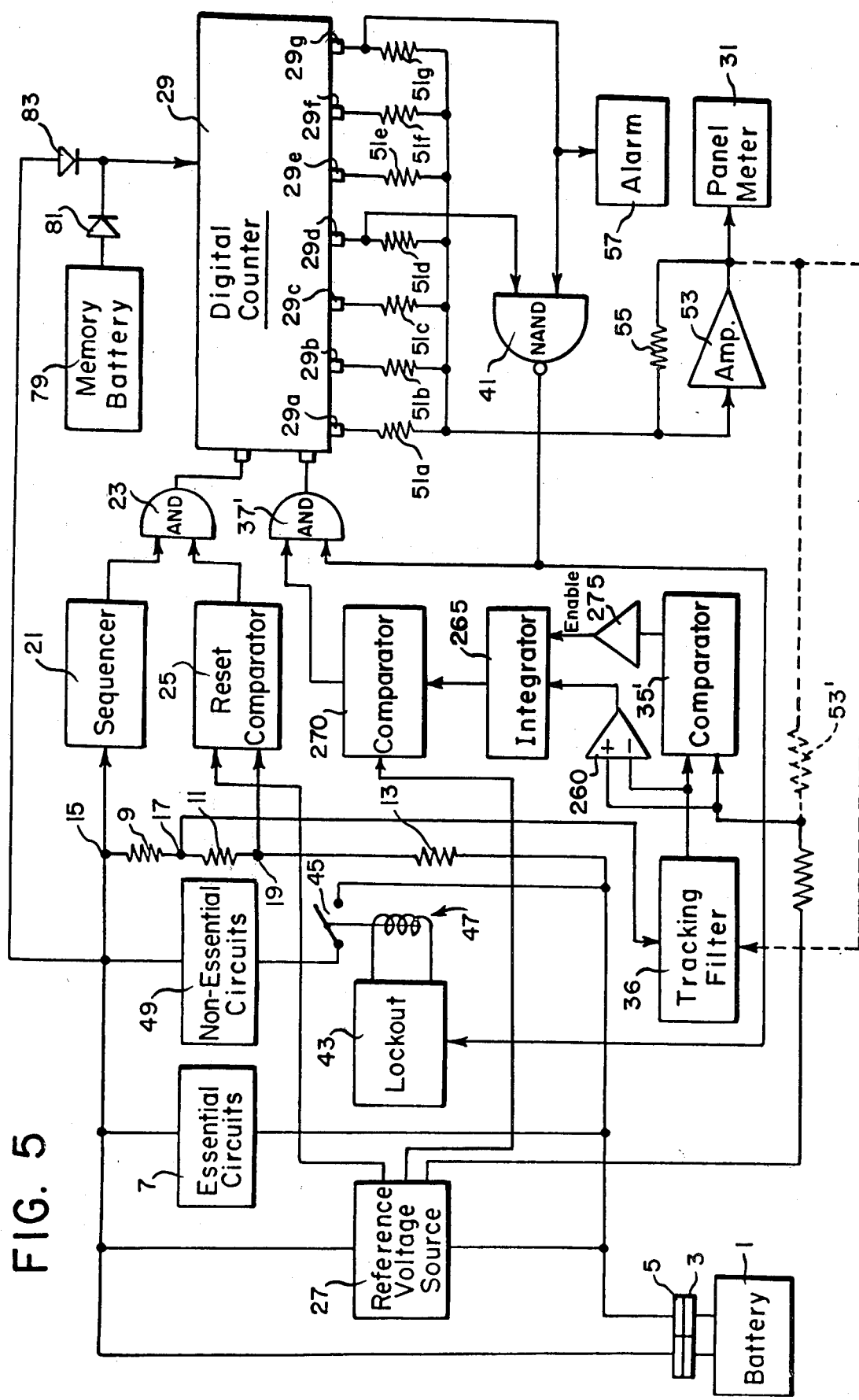

Numerous other refinements may be made in the logic used to trigger the signal applied to counter 29. For example, it may be desirable to trigger this signal only when the voltage excursions below threshold are sufficiently severe within a specified period of time. This performance can be obtained as shown in FIG. 5 by inserting a timing device into the connection between comparator 35' and the "enable" input to integrator 265. For example, as schematically shown in FIG. 5, the output of comparator 35' could be applied to a one-shot 275, instead of to integrator 265, and the output of the one-shot applied to the "enable" input to integrator 265. The operation of this circuit is the same as that of FIG. 4 except that integrator 260 is enabled only for the duration of the output pulse from one-shot 275. This output pulse, in turn, is triggered by a signal from comparator 35' when it detects that the battery terminal voltage has fallen below the reference voltage. As a result, a signal is applied to AND gate 37' only when the battery terminal voltage falls below the reference voltage and the integral of the particular excursion of battery terminal voltage below threshold is sufficiently great as to exceed a reference voltage applied to comparator 270 within the duration of the output pulse from one-shot 275.

Figure 6:
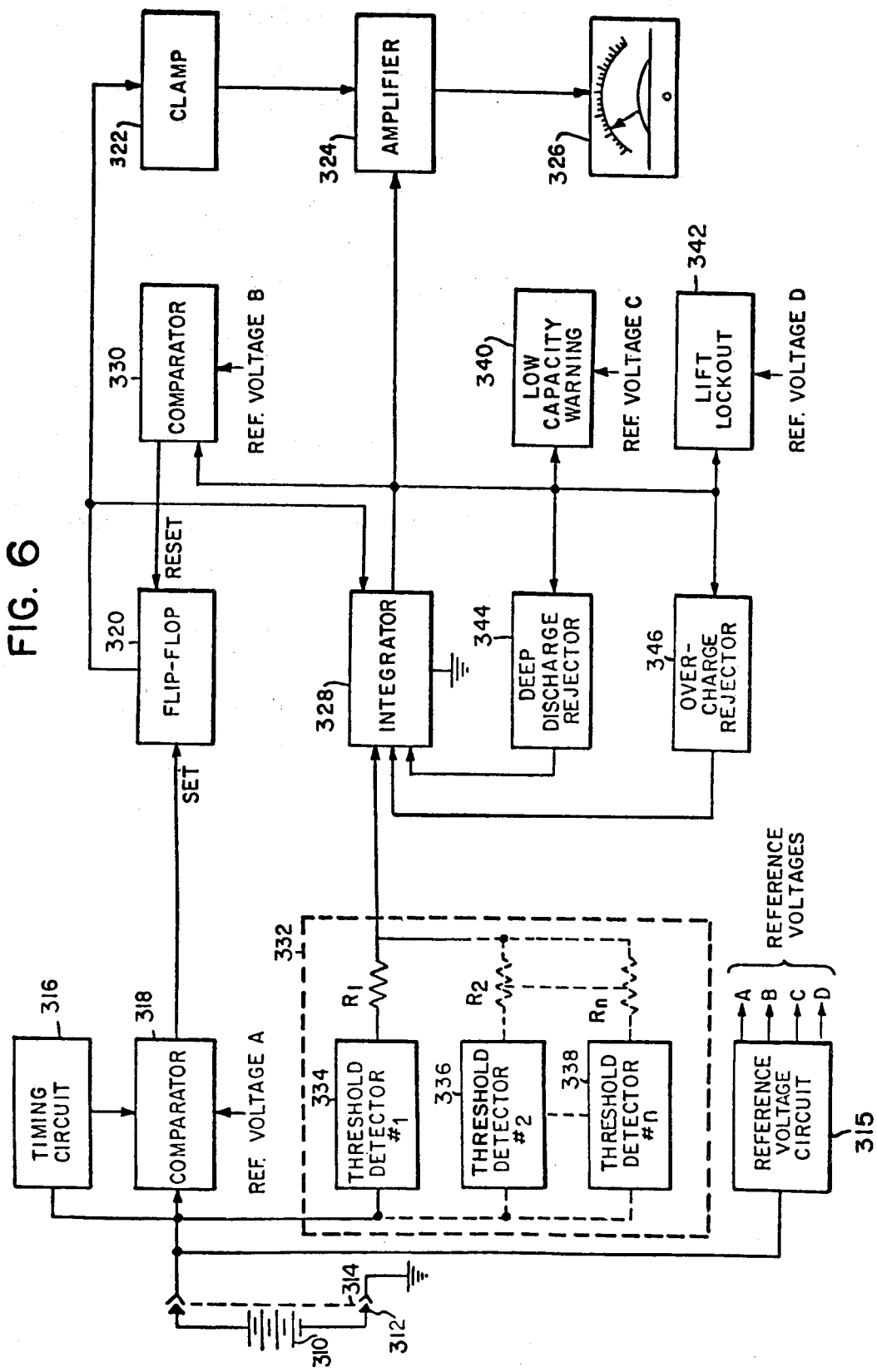

Another alternative embodiment of the invention is illustrated in FIG. 6. When it is desired to put a vehicle into service, a battery 310 is connected via connectors 312 and 314 into the vehicle's monitoring system. This causes actuation of a timing circuit 316 which, after a delay typically on the order of one second, actuates comparator 318 for a period also typically on the order of one second. If the voltage present at the output terminals of battery 310 is unusually high in comparison to the nominal terminal voltage, comparator 318 produces a pulse at its output. This pulse serves as an indication to the remaining circuitry in the system that the battery is sufficiently charged. The function of comparator 318 and timing circuit 316 is similar to that of sequencer 21 and reset comparator 25 of FIG. 1 and will not be discussed further.

Reference voltages are provided for comparator 318 and several other elements of the system by a reference voltage circuit 315 that produces reference voltages A, B, C and D using conventional circuitry. As shown reference voltage A is applied to comparator 318.

An integrator 328 is used to store a signal that is representative of state of charge. Initially, integrator 328 in the vehicle monitoring circuit has an integral stored in it which represents the state of charge of the last battery used in the vehicle. When a new battery is placed into the vehicle, it thus becomes necessary to reset the integrating device. When comparator 318 senses that an unusually high voltage is present across its input and hence that a new battery has been connected to the system, it sets a bistable circuit (e.g. a flip-flop) 320, whose output is used to set integrating device 328 to zero as will be explained below. Bistable 320 also actuates clamp circuit 322 which, through unity gain amplifier 324, causes the display of a full charge indication on meter 326. The clamp circuit thus causes the display of the full charge condition detected by comparator 318 regardless of the integral stored in the integrator. This is required since the integrator may take several minutes to reset, but it is desired to display the fully charged condition of the battery immediately.

Integrator 328 may comprise any circuit which is capable of integrating electrical information and providing an output signal which is proportional to the integral. Such an integrator circuit is shown in Eugene P. Finger and Edward M. Marwell's U.S. patent application Ser. No. 538,466, now U.S. Pat. No. 4,012,681, entitled "Battery Control System for Battery Operated Vehicles" filed Jan. 3, 1975, Edward M. Marwell and Curtis Beusman's U.S. Pat. No. 3,255,413 entitled "Electro-Chemical Coulometer Including Differential Capacitor Measuring Elements" and Eugene P. Finger's U.S. Pat. Nos. 3,704,431 and 3,704,432 entitled "Coulometer Controlled Variable Frequency Generator" and "Capacitive Coulometer Improvements".

In such integrator circuits, integration is performed by an electrochemical coulometer which receives current from an electrical signal source, the integral of whose output is indicative of the parameter which one wishes to monitor. Advancement of the coulometer results in changing the length of the mercury columns in the coulometer and consequently the capacitive coupling between the mercury columns and a metallic plate disposed around the body of the coulometer. An oscillator in series with a capacitor is put in parallel with the coulometer, thereby causing an AC voltage to appear on the plate. This electrical voltage is a function of the capacitance between the column of mercury in electrical contact with the capacitor and the plate disposed around the coulometer body. This AC voltage present on the plate is then amplified and sent to a simple amplitude detector which produces a DC output proportional to the peak-to-peak value of the AC voltage coupled to the plate. In the circuit of FIG. 6, this DC voltage is the output of integrator 328. As will be explained below, it is representative of the state of charge of the battery and is coupled to amplifier 324.

In such a system, resetting of the integrator is accomplished by passing a current through the coulometer. This current is in a direction opposite that of the signal source which advances the coulometer and has a magnitude relatively large compared to the magnitude of the current produced by that signal source. This may most conveniently be done by incorporating an SCR in bistable 320 and passing the output of bistable 320 through the coulometer.

The value of the integral stored in integrator 328 is sensed by comparator 330 and compared with a value corresponding to full charge voltage as determined by reference voltage B. When the integrator reaches full charge, the comparator resets bistable 320 which, in turn, disables clamp circuit 322. The output of integrator circuit 328 is then free to drive amplifier 324, thereby displaying on meter 326 the integral representative of the state of charge of battery 310 which is stored in the integrator.

As the charge stored in battery 310 is depleted, the placement of varying load conditions across the battery results in a corresponding fluctuation in the voltage present at the battery terminals. The present invention obtains a signal indicative of the state of charge of a battery by monitoring the magnitude and duration of drops in terminal voltage. The magnitude and duration of the decrease in terminal voltage is detected by circuit 332 and an output signal related thereto is applied to the integrator 328. Circuit 332 is a circuit which will produce a current at its output which is responsive to the voltage at the battery terminals. Thus, in the preferred embodiment, as the voltage at the output of battery terminal 310 drops below a threshold, circuit 332 is actuated to feed a current to integrator 328, thereby advancing integrator 328 so that the voltage level displayed on meter 326 decreases from that indicative of full charge. The output of circuit 332 is active only for the time when the voltage is below its threshold value and returns to its inactive state in response to a rise in terminal voltage above that threshold value.

In most batteries, the terminal voltage will drop below the threshold more frequently and for longer periods of time as the battery charge is increasingly depleted, but the relationship between time below threshold and state of charge is not linear. This non-linear relationship is compensated for through the non-linear action of circuit 332.

A particularly advantageous non-linear circuit 332 is illustrated in FIG. 6. This device comprises a threshold detector 334 which, when the voltage at the terminals of battery 310 drops below its threshold, produces an electrical signal which advances integrator 328. Further reductions in terminal voltage below successively lower thresholds results in actuation of successive threshold detectors 336 and 338. Detectors 334, 336 and 338 are sequentially and individually actuated (i.e., non-cumulatively) in response to voltage reductions with detectors 334, 336 and 338 having, respectively, high, medium and low thresholds and, respectively, high, medium and low outputs. This results in successively reducing the effect on integrator 328 of successively greater reductions in terminal voltage. Thus, as the frequency, duration and magnitude of voltage reductions increase, their increasing magnitude results in a successively decreasing effect on integrator 328.

Alternatively, detector 334 may produce a constant output once it is actuated, and detectors 336 and 338 may be successively and cumulatively actuated to produce outputs having opposite sense to and lesser but fixed magnitude in comparison to the output of detector 334. Detectors 336 and 338 would thus have the effect of reducing the output of circuit 332 as the magnitude of voltage reductions increases. In the alternative, the use of a non-linear display device will also serve the function of linearizing the display.

When the output of integrator 328 reaches a value corresponding to a first predetermined low state of charge in battery 310 as determined by reference voltage C, it triggers threshold circuit 340 which actuates a low capacity warning light in order to warn the operator of the battery's condition. Further use of the battery with corresponding further reduction in the output of integrator 328 results in the actuation of threshold circuit 342 when the output of the integrator reaches a still lower value determined by reference voltage D. Actuation of circuit 342 removes electricity from nonessential systems on a vehicle such as the lift, thereby leaving the vehicle with power applied only to such essential functions as the traction motor and forcing the operator to return to a central station for a newly charged battery.

Insofar as certain integrating devices such as electrochemical integrators may be damaged if they are driven beyond their limits of integration, deep discharge rejector 344 and overcharge rejector 346 will be responsive to the output of the integrator to prevent further integration at a point before the limits of integration of integrator 328 are exceeded. Rejector circuits 344 and 346 will thus protect integrator 328, during discharge of the battery and resetting of integrator 328, respectively. In the case of a system using an electochemical coulometer as an integrator, rejectors 344 and 346 may simply take the form of current sources which are activated by threshold circuits to produce at the limits of integration a current opposite in direction to the current which is advancing the electrochemical coulometer.

Figure 7:
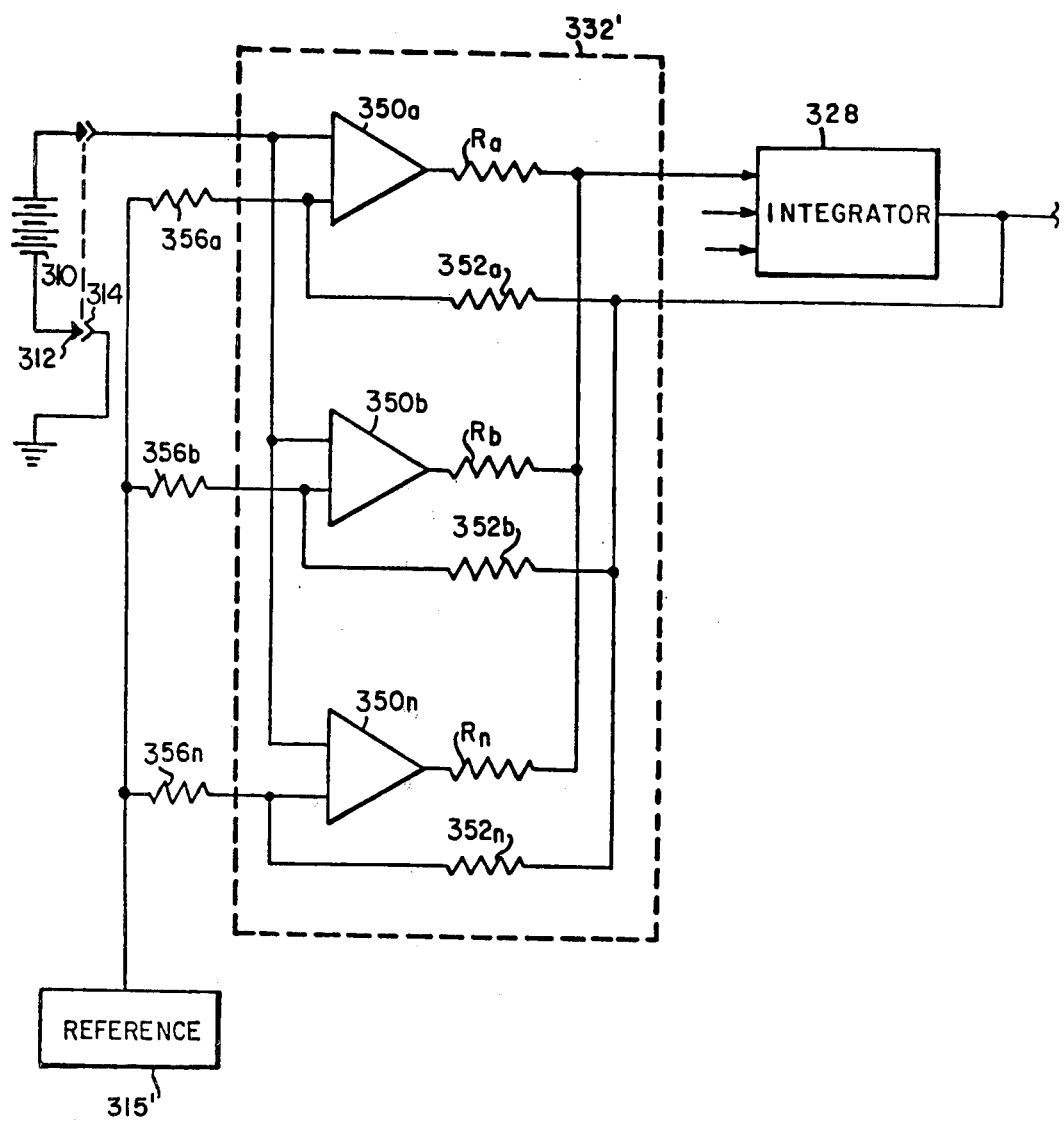
FIG. 7 is a schematic representation of an alternative threshold detection circuit.

Referring to FIG. 7, an alternate threshold detection circuit 332' is illustrated that can be used in place of the circuit 332. Threshold circuit 332' comprises threshold detectors 350a–n that are triggered at a voltage level responsive not only to the voltage present at the output of battery 310 but also to a feedback voltage coupled by resistors 352a–n from the output of integrator 328. Threshold detectors 350a–n advance integrator 328 at a rate proportional to the value of their respective output resistors $R_{a-n}$. Threshold detectors 350a–n may simply be comparators which change their output at different threshold values which are a function of the voltage fed back from integrator 328 by resistors 352a–n and reference voltages coupled from reference voltage source 315' by resistors 356a–n. For the circuit shown in FIG. 7, detectors 350a–n are successively and cumulatively actuated at different threshold values determined by reference voltage source 315' in a similar fashion as the alternative non-linear circuits 332 of FIG. 6 discussed three paragraphs above. Thus, comparator 350b couples a current through resistor Rb which is opposite in sense and lower in magnitude than the output of comparator 350a so that as the voltage at the battery terminal becomes lower and comparator 350b is actuated, the output of circuit 332' is reduced and causes a reduction in the rate at which the integrator advances. Comparators 350c–n operate in similar fashion with the limitation that the cumulative effect of operation of comparators 350b–n does not exceed the effect of operation of comparator 350a to which they are opposed.

The operation of this circuit is such that as the output of the integrator indicates the storage of an increasingly large integral (and therefore greater depletion of the battery), the output voltage that is fed back by resistor 352a serves to effectively lower the threshold values of the terminal voltage of battery 310 which will cause actuation of threshold detectors 350a–n. Thus, as the battery is depleted and the frequency and duration of the battery's tendency to drop below any given fixed threshold increases, the thresholds are lowered in order to require greater and greater reductions in terminal voltage to actuate comparators 350a–n. This feedback arrangement thus reduces or nullifies the relatively rapid advancement of the integrator that would occur as the battery's charge is increasingly depleted if the threshold of the detector circuit were not varied. At the same time it permits relatively rapid advancement of the integrator if the battery terminal voltage should go below threshold early in the operating cycle when the output of integrator 328 indicates a full charge or a value close thereto. This has the advantage of permitting the integrator to "catch up" if a partially charged battery has been connected by mistake to the monitoring system. If such a battery has been given a short high charge, its terminal voltage initially may be high enough to be accepted by comparator 318. Thereafter, however, the terminal voltage falls off quickly permitting relatively rapid advancement of the integrator, signifying that the battery has not been properly charged.

Further variations in the feedback circuit may be obtained by making resistors 352a–n non-linear resistive elements. This may also result in improving the linearity of the output of integrators 328 as an indication of the state of charge.

Although this circuit has been described using a plurality of comparators 350a–n, it will also work well with just a single comparator 350a. It should also be noted that just as the threshold of the threshold circuit may be varied in response to the value stored in the integrator as is done in the embodiment illustrated in FIG. 7 so also may the output of the threshold circuit be varied in response to the output of the integrator. For example, this may be done by using in place of resistors Ra-n photoresistive devices whose resistance changes in response to incident light. The output of integrator 328 may then be made to drive a light source whose light would be made to fall upon the photoresistive devices and thus vary their resistance as the output of integrator 328 is varied. Variation of the resistance of the photoresistive devices results in varying the current output of comparators 350a-n, thereby varying the output of the threshold circuit.

As will be apparent, a plurality of threshold detectors may also be used in the circuits illustrated in FIGS. 1-5 to synthesize any desired response by the selection of various thresholds and various electrical outputs for each of the plurality of threshold detectors. For example, a synthesized response can readily be used to charge capacitor 65 of FIG. 2; or apparatus could be provided to apply clocking pulses to the digital counter 20 of FIG. 1 at different rates depending on which threshold detector was activated. The feedback circuits shown in FIGS. 6 and 7 can likewise be implemented in the apparatus for FIGS. 1-5 as is indicated by resistor 53' of FIGS. 1-5. In the embodiment of FIG. 3, a plurality of Schmitt triggers could be used, each of which has a different threshold value so that the number of pulses produced is a measure of the severity of the voltage reduction. Alternatively, one or more threshold detectors could be similar to the devices of FIGS. 1 and 2 which produce a number of output pulses depending on the duration of time the battery terminal voltage is below threshold and other threshold detectors could be like that of FIG. 3 which produces only a single output pulse each time the battery terminal voltage falls below threshold.

As is suggested by the embodiments of FIGS. 4 and 5, numerous intricate systems can be devised for forming the intermediate output signal once the battery terminal voltage is determined to have fallen below a threshold value. For example, in some applications it is believed that the time it takes the battery to recover from a very low voltage is a good indication of its state of charge. To measure this time, one may use a comparator such as comparator 35' to detect when the battery terminal voltage falls below threshold and to turn on a differentiator in response thereto. The differentiator detects when the slope of the battery terminal voltage goes through zero and the voltage begins to recover. It then produces an output signal until the voltage rises above the threshold voltage of the comparator, at which point the differentiator is turned off. The output signal can be integrated by forming pulses and counting them as in FIG. 1 or by applying the signal directly to an integrator such as integrator 328 of FIG. 6.

If desired the reference voltage applied to differential amplifier 260 of FIGS. 4 and 5 may have a different value from that applied to comparator 35'. Such a voltage may be derived by a separate tap from reference voltage source 27. As in the embodiments shown in FIGS. 4 and 5, this reference voltage may be modified as the battery is depleted by a feedback voltage from the output of amplifier 53. In similar fashion, the reference voltage applied to comparator 270 may also be modified by a feedback voltage from the output of amplifier 53.

The embodiments in FIGS. 1-7 disclose a system in which a threshold circuit produces an intermediate output signal when the magnitude of the battery terminal voltage is less than threshold value. This signal is then integrated over a plurality of different intervals in which the magnitude of the battery terminal voltage is less than the threshold value. The integrated signal provides a first output signal which we have found is a useful measure of the state of charge of the battery.

As is evident from FIGS. 1-7, the apparatus of our invention may take many forms. Numerous other devices and configurations of components, which are within the scope of our invention, will be apparent to those skilled in the art. All such devices in which an intermediate output signal is produced, directly or indirectly, in connection with a fall in the magnitude of battery terminal voltage to less than a threshold value are intended to be encompassed by the monitoring and signal producing means of the broadest claims. Likewise, unless otherwise indicated, the integrating means of the claims is intended to be read broadly to cover all types of analog and digital integrating devices.

The intermediate output signal may take many forms. For example, it can be a digital signal or an analog signal. If it is a digital signal, it may be a single event or a plurality of events such as a train of pulses.

In the embodiments shown in FIGS. 1, 2, 6 and 7, the first output signal, which is the integral of the intermediate output signal, may generally be described as a monotonic function of the time that the magnitude of said terminal voltage is below is threshold value. And since the threshold circuit is not activated until the magnitude of the terminal voltage is below a threshold value, the first output signal in the embodiments of FIGS. 1-7 may be described as a function of the magnitude of the terminal voltage. In the embodiments shown in FIGS. 1-5, the magnitude of the intermediate output signal does not vary with the magnitude of the battery terminal voltage provided that magnitude is less than the threshold value. With the particular threshold detectors 334, 336, 338 and 350a-n shown in FIGS. 6 and 7, the output of individual threshold detectors does not vary with the battery terminal voltage applied thereto once the battery terminal voltage falls below threshold and an output signal is produced. However, as is apparent from the use of comparator 35' and differential amplifier 260 in the embodiments of FIGS. 4 and 5, individual threshold detection circuits can be formed in which the output varies with the difference between the battery terminal voltage and a reference voltage. Moreover, where a plurality of threshold detectors are used, the magnitude of the intermediate output signal does vary as a function of the magnitude of the battery terminal voltage when the battery terminal voltage is below the first threshold value.

In the embodiments shown in FIGS. 6 and 7, this variation is in discrete steps. Appropriate circuitry for providing an analogue intermediate output signal will also be evident to those skilled in the art. For example, the output of integrator 265 of FIG. 4 is an analogue signal that is the integral of the battery terminal voltage below a threshold value. This signal can be integrated in analogue fashion by applying it directly to an integrator such as integrator 328 of FIG. 6.

The intermediate output signal from each of the threshold detectors shown in FIG. 7 will be recognized as a function of the difference between the battery terminal voltage and a reference voltage that is a function of the output of integrator 328 and the output of reference source 315'. As will be evident, various transfer functions can be synthesized depending on the particular feedback circuitry used. All these modifications are contemplated to be within the scope of the invention.

It should also be noted that the threshold value at which a comparator commences production of the intermediate output signal need not be the same as that at which it stops producing said signal. The case of a Schmitt trigger illustrates one example of a system where the threshold value for switching from a first output state to a second is not the same as that for switching from the second state back to the first. The threshold value may also be varied during the period that an intermediate output signal is being produced. For example, in those devices in which there is feedback from the integrator the threshold value may vary during the period of time the battery terminal voltage is below it. It may also be advantageous to produce an intermediate output signal which continues for a fixed period of time after the voltage rises above the threshold. Finally, it should be recognized that transient excursions below the threshold value will not be integrated in those circuits that use a filter to eliminate such transients.

Since the invention can be practiced using either a positive voltage polarity or a negative voltage polarity, it will be recognized that either one is fully the equivalent of the other and both are within the intended scope of the claims.

What is claimed is:

1. Apparatus for monitoring the condition of a battery during its discharge from a charged condition comprising:
   means for monitoring the output terminal voltage of the battery and producing an intermediate output signal for at least some instances when the magnitude of the terminal voltage falls below a threshold value during said discharge;
   means for integrating said intermediate output signal over a plurality of reductions in the magnitude of the terminal voltage which produce an intermediate output signal; and
   means for producing a first output signal related to the integral formed by said integrating means.

2. The apparatus of claim 1 wherein said intermediate output signal is a function of the time that the magnitude of said terminal voltage is below said threshold value.

3. The apparatus of claim 1 wherein said intermediate output signal is directly proportional to approximately the time that the magnitude of said terminal voltage is below said threshold value.

4. The apparatus of claim 1 wherein said intermediate output signal is a function of the time that the magnitude of said terminal voltage is below said threshold value and is also a function of the difference between the output terminal voltage and a reference voltage.

5. The apparatus of claim 1 wherein said intermediate output signal is a function of the time that the magnitude of said terminal voltage is below said threshold value and is also a function of the difference between the output terminal voltage and a reference voltage that is a function of the first output signal.

6. The apparatus of claim 1 wherein said intermediate output signal is a function of the time that the magnitude of said terminal voltage is below said threshold value and is also a function of the output terminal voltage, a reference voltage, and the first output signal.

7. The apparatus of claim 1 further comprising means for varying said threshold value, during said discharge, as a function of said first output signal.

8. The apparatus of claim 1 wherein said intermediate output signal comprises at least one change in an output from said monitoring and signal producing means and said integrating means comprises means for counting said changes in said output.

9. The apparatus of claim 1 wherein said monitoring and signal producing means comprises a comparator responsive to the output terminal voltage and a source of reference voltage to produce an intermediate output signal at least sometimes when the magnitude of the terminal voltage is below said threshold value.

10. The apparatus of claim 1 wherein said monitoring and signal producing means comprises:
    means for detecting when the output terminal voltage of the battery is less than a threshold value;
    means controlled by said detecting means for integrating a signal related to said battery terminal voltage when the output terminal voltage of the battery is less than said threshold value; and
    means for comparing said integrated signal with a reference value and for producing said intermediate output signal when said integrated signal exceeds said reference value.

11. The apparatus of claim 10 wherein said integrating means controlled by said detecting means integrates the difference between the battery terminal voltage and a threshold value.

12. The apparatus of claim 10 further comprising a timing device which prevents said intermediate output signal from being produced unless said integrated signal exceeds said reference value within a predetermined time interval established by said timing device.

13. The apparatus of claim 1 wherein the intermediate output signal is a single pulse for each reduction in the magnitude of the output terminal voltage which produces an intermediate output signal and said integrating means counts said pulses, said first output signal being a function of the number of pulses produced in response to reductions in the magnitude of the terminal voltage.

14. The apparatus of claim 1 wherein:
    the intermediate output signal comprises a series of pulses, the number of pulses being a function of at least the time that the magnitude of said terminal voltage is below said threshold value; and
    said integrating means is responsive to said pulses to produce said first output signal, said first output signal being a function of the number of pulses produced in response to reductions in the magnitude of the terminal voltage.

15. The apparatus of claim 14 further comprising a voltage controlled oscillator for producing said series of pulses when the magnitude of the terminal voltage is below said threshold value.

16. The apparatus of claim 14 further comprising:
    an oscillator for continuously producing a series of pulses; and
    gate means that passes said series of pulses when the magnitude of the terminal voltage is below said threshold value.

17. The apparatus of claim 14 further comprising relaxation oscillator means for producing said series of pulses when the magnitude of the terminal voltage is below said threshold value.

18. The apparatus of claim 14 further comprising means for varying the pulse repetition rate of the intermediate output signal, whereby the integration time of the integrating means is likewise varied.

19. The apparatus of claim 1 further comprising:

means responsive to the connection of said apparatus to a battery for sensing whether the magnitude of the output terminal voltage of said battery is above an upper threshold greater than the nominal terminal voltage of the battery; and means responsive to an output of said sensing means for resetting said integrating means.

20. The apparatus of claim 19 wherein the integrating means is reset over a period of time, said apparatus further comprising:

means responsive to said resetting means for coupling a signal to a display device indicating that there is a full charge in said battery; and means responsive to said integrating means for detecting when said integrating means has been reset and for then disabling said resetting means and therefore said coupling means.

21. The apparatus of claim 1 wherein:

said means for monitoring terminal voltage comprises a plurality of threshold detectors, each of said detectors having a different threshold value and being responsive to said terminal voltage to produce an intermediate output signal when the magnitude of the terminal voltage is less than its respective threshold value; and said integrating means integrates all intermediate output signals, whereby a desired threshold detection response may by synthesized through the selection of various thresholds and various electrical outputs for each of the plurality of threshold detectors.

22. The apparatus of claim 21 wherein said plurality of threshold detectors are successively actuated and their intermediate output signals are cumulated.

23. The apparatus of claim 21 wherein said plurality of threshold detectors are sequentially actuated one at a time in a predetermined sequence corresponding to the threshold level of each of said plurality of said threshold detectors so that no more than one detector is producing an intermediate output signal at any time.

24. The apparatus of claim 1 further comprising means for disconnecting at least a portion of a load connected to said battery when the first output signal reaches a predetermined level.

25. The apparatus of claim 1 wherein said monitoring and signal producing means comprises:

means for detecting when the output terminal voltage of the battery is less than a threshold value and for applying a signal indicative thereof to an output;

means for sampling said output from said detecting means; and means for applying an intermediate output signal to said integrating means whenever the sampling means samples a signal indicating that the output terminal voltage of the battery is less than a threshold value.

26. The apparatus of claim 1 further comprising a display means driven by said first output signal, said display means producing a display representative of battery state of charge.

27. Apparatus for monitoring the condition of a battery during its discharge from a charged condition comprising:

means for monitoring at least a portion of the frequency spectrum of the output terminal voltage of the battery and for producing an intermediate output signal when the magnitude of said monitored portion of the output terminal voltage is less than a threshold value during said discharge;

means for integrating said intermediate output signal over a plurality of reductions in the magnitude of said monitored portion of the output terminal voltage to less than said threshold value; and means for producing a first output signal related to the integral formed by said integrating means.

28. The apparatus of claim 27 wherein said intermediate output signal is a function of the time that the magnitude of said monitored portion of the output terminal voltage is below said threshold value.

29. The apparatus of claim 27 wherein said intermediate output signal is a function of the time that the magnitude of said monitored portion of the output terminal voltage is below said threshold value and is also a function of the difference between said monitored portion of the output terminal voltage and a reference voltage.

30. The apparatus of claim 27 wherein said intermediate output signal is a function of the time that the magnitude of said monitored portion of the output terminal voltage is below said threshold value and is also a function of the difference between said monitored portion of the output terminal voltage and a reference voltage that is a function of the first output signal.

31. The apparatus of claim 27 wherein said intermediate output signal is a function of the time that the magnitude of said monitored portion of the output terminal voltage is below said threshold value and is also a function of said monitored portion of the output terminal voltage, a reference voltage, and the first output signal.

32. The apparatus of claim 27 wherein the intermediate output signal is a series of pulses, said apparatus further comprising means for varying the pulse repetition rate of the intermediate output signal, whereby the integration time of the integrating means is likewise varied.

33. The apparatus of claim 27 further comprising means for disconnecting at least a portion of a load connected to said battery when the first output signal reaches a predetermined level.

34. The apparatus of claim 27 wherein said intermediate output signal is directly proportional to approximately the time that the magnitude of said monitored portion of the output terminal voltage is below said threshold value.

35. The apparatus of claim 27 further comprising means for varying said threshold value, during said discharge, as a function of said first output signal.

36. The apparatus of claim 27 further comprising a display means driven by said first output signal, said display means producing a display representative of battery state of charge.

37. Apparatus for monitoring the condition of a battery during its discharge from a charged condition comprising:

means for monitoring the output terminal voltage of the battery and producing an intermediate output signal for at least some instances when the magnitude of the terminal voltage is less than a threshold value;

means for forming the integral of said intermediate output signal and accumulating said integral over a plurality of periods in which said intermediate output signal is produced, such intermediate-output-signal-producing periods occurring during said discharge; and means for producing a first output signal related to said accumulated integral of said intermediate output signal.

38. The apparatus of claim 37 wherein said monitoring and signal producing means comprises a comparator responsive to the output terminal voltage and a source of reference voltage to produce said intermediate output signal when the magnitude of the terminal voltage falls below said threshold value.

39. The apparatus of claim 37 wherein said intermediate output signal is a function of the time that the magnitude of said terminal voltage is below said threshold value.

40. The apparatus of claim 37 wherein said intermediate output signal is directly proportional to approximately the time that the magnitude of said terminal voltage is below said threshold value.

41. The apparatus of claim 37 further comprising means for varying said threshold value, during said discharge, as a function of said first output signal.

42. The apparatus of claim 37 further comprising means for disconnecting at least a portion of a load connected to said battery when the first output signal reaches a predetermined level.

43. The apparatus of claim 37 further comprising a display means driven by said first output signal, said display means producing a display representative of battery state of charge.

44. Apparatus for monitoring the condition of a battery during its discharge from a charged condition comprising means for sensing the output terminal voltage of the battery and producing in response thereto a series of pulses, the number of pulses being proportional to the time that said terminal voltage is below a threshold value, and means responsive to said pulses for counting the number of pulses produced throughout said discharge.

45. The apparatus of claim 44 wherein said sensing means comprises a comparator responsive to the terminal voltage and a source of reference voltage.

46. The apparatus of claim 44 further comprising means for varying said threshold value, during said discharge, as a function of the number of pulses counted by said counting means.

47. The apparatus of claim 44 further comprising means for disconnecting at least a portion of a load connected to said battery when the count reaches a predetermined level.

48. The apparatus of claim 44 further comprising means for producing a first output signal related to said count.

49. The apparatus of claim 48 further comprising a display means driven by said first output signal, said display means producing a display representative of battery state of charge.

50. Apparatus for monitoring the condition of a battery during its discharge from a charged condition comprising:
means for sensing at least some reductions in the output terminal voltage of the battery and producing in response thereto at least a single pulse for at least some sensed reductions in voltage to less than a threshold value;
means for counting said pulses over a plurality of such pulse-producing reductions occurring during said discharge; and
means for producing a first output signal related to said count.

51. The apparatus of claim 50 wherein said sensing and pulse producing means comprises means for producing a series of pulses in which the number of pulses is a function of the time that the magnitude of said terminal voltage is below said threshold value.

52. The apparatus of claim 51 wherein said means for producing a series of pulses includes means for varying the repetition rate of the pulses whereby the length of time required for the counting means to reach a given count may also be varied.

53. The apparatus of claim 50 wherein said sensing and pulse producing means comprises means for producing a series of pulses approximately proportional in number to the time that said battery terminal voltage is below said threshold value.

54. The apparatus of claim 50 wherein said sensing and pulse producing means comprises means for producing a series of pulses in which the number of pulses is a function of the time that the magnitude of said terminal voltage is below said threshold value and is also a function of the difference between the output terminal voltage and a reference voltage.

55. The apparatus of claim 50 wherein said sensing and pulse producing means comprises means for producing a series of pulses in which the number of pulses is a function of the time that the magnitude of said terminal voltage is below said threshold value and is also a function of the difference between the output terminal voltage and a reference voltage that is a function of the first output signal.

56. The apparatus of claim 50 wherein said sensing and pulse producing means comprises means for producing a series of pulses in which the number of pulses is a function of the time that the magnitude of said terminal voltage is below said threshold value and is also a function of the output terminal voltage, a reference voltage, and the first output signal.

57. The apparatus of claim 50 further comprising means for disconnecting at least a portion of a load connected to said battery when the first output signal reaches a predetermined level.

58. The apparatus of claim 50 further comprising means for varying said threshold value, during said discharge, as a function of the number of pulses counted by said counting means.

59. The apparatus of claim 50 further comprising a display means driven by said first output signal, said diplay means producing a display representative of battery state of charge.

60. A method for monitoring the condition of a battery connected in a system in which it is subjected to transient reductions in voltage during its discharge from a charged condition, said method comprising the steps of:
producing an intermediate output signal for at least some instances when the magnitude of said terminal voltage falls below a threshold value during said discharge;
integrating said intermediate output signal over a plurality of reductions in the magnitude of the output terminal voltage which produce an intermediate output signal; and
producing a first output signal related to the integral formed by said integrating step.

61. The method of claim 60 wherein the intermediate output signal is a function of the time that the magnitude of said terminal voltage is below said threshold value.

62. The method of claim 60 wherein the intermediate output signal is directly proportional to approximately the time that the magnitude of said terminal voltage is below said threshold value.

63. The method of claim 60 wherein the intermediate output signal is a function of the time that the magnitude of said terminal voltage is below said threshold value and is also a function of the difference between the output terminal voltage and a reference voltage.

64. The method of claim 60 wherein the intermediate output signal is a function of the time that the magnitude of said terminal voltage is below said threshold value and is also a function of the difference between the output terminal voltage and a reference voltage that is a function of the first output signal.

65. The method of claim 60 wherein the intermediate output signal is a function of the time that the magnitude of said terminal voltage is below said threshold value and is also a function of the output terminal voltage, a reference voltage and the first output signal.

66. The method of claim 60 wherein:
said signal producing step comprises the step of producing at least one pulse each time the output terminal voltage falls below said threshold value; and
the integrating step comprises the step of counting said pulses.

67. The method of claim 60 wherein:
said signal producing step comprises the step of producing a series of pulses in response to reductions in the output terminal voltage to less than said threshold value, the number of pulses being a function of the time that said terminal voltage is below said threshold value; and
the integrating step comprises the step of counting said pulses.

68. The method of claim 67 wherein said pulses are produced by coupling the output of an oscillator to an integrator when the output terminal voltage is below said threshold value.

69. The method of claim 60 further comprising the steps of:
sensing, when the battery is connected to the system, whether the magnitude of the output terminal voltage of said battery is above an upper threshold; and
resetting said stored integral to an initial value if the magnitude of the output terminal voltage is above said upper threshold.

70. The method of claim 60 wherein a plurality of intermediate output signals are produced and all intermediate output signals are combined, each of said output signals being produced in response to a reduction in the magnitude of battery terminal voltage below a different threshold value, whereby a desired threshold detection response may be synthesized through the selection of various thresholds and various magnitudes of electrical outputs for each of said thresholds.

71. The method of claim 70 wherein said plurality of intermediate output signals are successively produced and said signals are cumulated.

72. The method of claim 70 wherein said plurality of outputs are sequentially produced so that no more than one output is being produced at any time, the particular output produced being a function of the magnitude of the reduction in voltage.

73. The method of claim 60 further comprising the step of varying the threshold value, during said discharge, as a function of the first output signal.

74. The method of claim 60 further comprising the step of using said first output signal to drive a display representative of battery state of charge.

75. The method of claim 60 further comprising the step of disconnecting at least a portion of a load connected to said battery when the output signal reaches a predetermined level.

76. A method for monitoring the condition of a battery connected in a system in which it is subjected to transient reductions in voltage during its discharge from a charged condition, said method comprising the steps of:
sensing at least some reductions in the magnitude of the output terminal voltage of the battery and producing in response thereto at least a single pulse for at least some sensed reductions in voltage below a threshold value;
counting said pulses over a plurality of such pulse producing reductions occurring during said discharge; and
producing a first output signal related to said count.

77. The method of claim 76 wherein the number of pulses produced for each reduction in voltage below a threshold value is a function of the time that the magnitude of said terminal voltage is below said threshold value.

78. The method of claim 76 wherein the number of pulses produced for each reduction in voltage below a threshold value is directly proportional to approximately the time that the magnitude of said terminal voltage is below said threshold value.

79. The method of claim 76 wherein the number of pulses produced for each reduction in voltage below a threshold value is a function of the time that the magnitude of said terminal voltage is below said threshold value and is also a function of the difference between the output terminal voltage and a reference voltage.

80. The method of claim 76 wherein the number of pulses produced for each reduction in voltage below a threshold value is a function of the time that the magnitude of said terminal voltage is below said threshold value and is also a function of the difference between the output terminal voltage and a reference voltage that is a function of the first output signal.

81. The method of claim 76 wherein the number of pulses produced for each reduction in voltage below a threshold value is a function of the time that the magnitude of said terminal voltage is below said threshold value and is also a function of the difference between the output terminal voltage, a reference voltage, and the first output signal.

82. The method of claim 76 further comprising the step of varying the threshold value, during said discharge, as a function of the first output signal.

83. The method of claim 76 further comprising the step of using said first output signal to drive a display representative of battery state of charge.

84. The method of claim 76 further comprising the step of disconnecting at least a portion of a load connected to said battery when the output signal reaches a predetermined level.

85. A method for monitoring the condition of a battery connected in a system in which it is subjected to transient reductions in voltage during its discharge from a charged condition, comprising the steps of:
monitoring at least a portion of the frequency spectrum of the output terminal voltage of a battery;

producing an intermediate output signal when the magnitude of said monitored portion of the output terminal voltage is less than a threshold value;

integrating said intermediate output signal over a plurality of intermediate-output-signal-producing events occurring during said discharge; and producing a first output signal related to the integral formed by said integrating step.

86. The method of claim 85 wherein the intermediate output signal is a function of the time that the magnitude of the monitored portion of said terminal voltage is below said threshold value.

87. The method of claim 79 wherein the intermediate output signal is directly proportional to approximately the time that the magnitude of said monitored portion of the output terminal voltage is below said threshold value.

88. The method of claim 85 wherein the intermediate output signal is a function of the time that the magnitude of said monitored portion of the terminal voltage is below said threshold value and is also a function of the difference between the monitored portion of the output terminal voltage and a reference voltage.

89. The method of claim 85 wherein the intermediate output signal is a function of the time that the magnitude of said monitored portion of the terminal voltage is below said threshold value and is also a function of the difference between said monitored portion of the output terminal voltage and a reference voltage that is a function of the first output signal.

90. The method of claim 85 wherein the intermediate output signal is a function of the time that the magnitude of said monitored portion of the terminal voltage is below said threshold value and is also a function of said monitored portion of the output terminal voltage, a reference voltage and the first output signal.

91. The method of claim 85 further comprising the step of varying the threshold value, during said discharge, as a function of the first output signal.

92. The method of claim 85 further comprising the step of using said first output signal to drive a display representative of battery state of charge.

93. The method of claim 85 further comprising the step of disconnecting at least a portion of a load connected to said battery when the output signal reaches a predetermined level.

94. A method for monitoring the condition of a battery connected in a system in which it is subjected to transient reductions in voltage during its discharge from a charged condition, said method comprising the steps of:

producing an intermediate output signal for at least some reductions in the magnitude of the output terminal voltage of the battery to less than a threshold value which occur during said discharge;

forming the integral of said intermediate output signal and accumulating said integral over a plurality of such reductions for which an intermediate output signal is produced; and producing a first output signal related to said accumulated integral of said intermediate output signal.

95. The method of claim 94 wherein the intermediate output signal is a function of the time that the magnitude of said terminal voltage is below said threshold value.

96. The method of claim 94 wherein the intermediate output signal is directly proportional to approximately the time that the magnitude of said terminal voltage is below said threshold value.

97. The method of claim 94 wherein the intermediate output signal is a function of the time that the magnitude of said terminal voltage is below said threshold value and is also a function of the difference between the output terminal voltage and a reference voltage.

98. The method of claim 94 wherein the intermediate output signal is a function of the time that the magnitude of said terminal voltage is below said threshold value and is also a function of the difference between the output terminal voltage and a reference voltage that is a function of the first output signal.

99. The method of claim 94 wherein the intermediate output signal is a function of the time that the magnitude of said terminal voltage is below said threshold value and is also a function of the output terminal voltage, a reference voltage and the first output signal.

100. The method of claim 94 further comprising the step of varying the threshold value, during said discharge, as a function of the first output signal.

101. The method of claim 94 further comprising the step of using said first output signal to drive a display representative of battery state of charge.

102. The method of claim 94 further comprising the step of disconnecting at least a portion of a load connected to said battery when the output signal reaches a predetermined level.

103. Apparatus for producing a signal representative of the decrease in state-of-charge of a battery during its discharge from a charged condition said apparatus comprising:

means for monitoring the output terminal voltage of the battery and producing an intermediate output signal for at least some instances when the magnitude of the terminal voltage falls below a threshold value during said discharge;

means for integrating said intermediate output signal over a plurality of reductions in the magnitude of the terminal voltage which produce an intermediate output signal; and means for producing a first output signal related to the integral formed by said integrating means, said first output signal being representative of the decrease in state-of-charge of said battery.

104. The apparatus of claim 103 wherein said intermediate output signal is a function of the time that the magnitude of said terminal voltage is below said threshold value.

105. The apparatus of claim 103 wherein said intermediate output signal is directly proportional to approximately the time that the magnitude of said terminal voltage is below said threshold value.

106. The apparatus of claim 102 further comprising means for varying said threshold value, during said discharge, as a function of said first output signal.

107. The apparatus of claim 102 further comprising means for disconnecting at least a portion of a load connected to said battery when the first output signal reaches a predetermined level.

108. The apparatus of claim 102 further comprising a display means driven by said first output signal, said display means producing a display representative of battery state of charge.

109. The apparatus of claim 102 wherein the integral formed by said integrating means changes monotonically during said discharge.

110. The apparatus of claim 102 wherein said intermediate output signal comprises at least one change in an output from said monitoring and signal producing means and said integrating means comprises means for counting said changes in said output.

111. A method for producing a signal representative of the decrease in state-of-charge of a battery connected in a system in which it is subjected to transient reductions in voltage during its discharge from a charged condition, said method comprising the steps of:
producing an intermediate output signal for at least some instances when the magnitude of said terminal voltage falls below a threshold value during said discharge;
integrating said intermediate output signal over a plurality of reductions in the magnitude of the output terminal voltage which produce an intermediate output signal; and
producing a first output signal related to the integral formed by said integrating step, said first output signal being representative of the decrease in state-of-charge of said battery.

112. The method of claim 111 wherein the intermediate output signal is a function of the time that the magnitude of said terminal voltage is below said threshold value.

113. The method of claim 111 wherein the intermediate output signal is directly proportional to approximately the time that the magnitude of said terminal voltage is below said threshold value.

114. The method of claim 111 further comprising the step of varying the threshold value, during said discharge, as a function of the first output signal.

115. The method of claim 111 further comprising the step of using said first output signal to drive a display representative of battery state of charge.

116. The method of claim 111 further comprising the step of disconnecting at least a portion of a load connected to said battery when the output signal reaches a predetermined level.

117. The method of claim 111 wherein the integral formed by said integrating step changes monotonically during said discharge.

118. The method of claim 111 wherein said intermediate output signal comprises at least one change in a signal level and said integrating step comprises the step of counting such changes.

119. The apparatus of claim 1 wherein the integral formed by said integrating means changes monotonically during said discharge.

120. The apparatus of claim 27 wherein said intermediate output signal comprises at least one change in an output from said monitoring and signal producing means and said integrating means comprises means for counting said charges in said output.

121. The apparatus of claim 27 wherein the integral formed by said integrating means changes monotonically during said discharge.

122. The apparatus of claim 37 wherein said intermediate output signal comprises at least one change in an output from said monitoring and signal producing means and said means for forming and accumulating the integral of said intermediate output signal comprises means for counting such changes in said output.

123. The apparatus of claim 37 wherein the integral that is formed and accumulated changes monotonically during said discharge.

124. The method of claim 60 wherein the integral formed by said integrating step changes monotonically during said discharge.

125. The method of claim 60 wherein said intermediate output signal comprises at least one change in a signal lever and said integrating step comprises the step of counting such changes.

126. The method of claim 35 wherein the integral formed by said integrating step changes monotonically during said discharge.

127. The method of claim 35 wherein said intermediate output signal comprises at least one change in a signal lever and said integrating step comprises the step of counting such changes.

128. The method of claim 94 wherein the integral that is formed and accumulated changes monotonically during said discharge.

129. The method of claim 94 wherein said intermediate output signal comprises at least one change in a signal level and the step of forming and accumulating the integral of the intermediate output signal comprises the step of counting such changes.

* * * * *

UNITED STATES PATENT AND TRADEMARK OFFICE
CERTIFICATE OF CORRECTION

PATENT NO. : 4,193,026

DATED : March 11, 1980

INVENTOR(S) : Eugene P. Finger and Eugene A. Sands

It is certified that error appears in the above-identified patent and that said Letters Patent are hereby corrected as shown below:

Column 2, line 68, after "a" and before "powered" delete "batter" and substitute therefor --battery--.

Column 3, line 53, delete "a" (first word) and substitute therefor --at--;

line 68, delete "terminal" (first word).

Column 4, line 27, after "gate" and before "cause" insert --41--.

Column 5, line 28, within the first set of quotation marks, delete "11" and substitute therefor --1--.

Column 6, line 5, delete "systems" (first word) and substitute therefor --system--;

line 6, delete "In" (last word) and substitute therefor --It--.

Column 14, line 28, after "below" and before "threshold" delete "is" and substitute therefor --a--.

Claims 106, 107, and 108, line 1, after "claim" and before "further" delete "102" and substitute therefor --103--.

Claims 109 and 110, line 1, after "claim" and before "wherein" delete "102" and substitute therefor --103--.

Claim 120, line 5, after "said" and before "in" delete "charges" and substitute therefor --changes--.

UNITED STATES PATENT AND TRADEMARK OFFICE
CERTIFICATE OF CORRECTION

PATENT NO. : 4,193,026

DATED : March 11, 1980

INVENTOR(S) : Eugene P. Finger and Eugene A. Sands

It is certified that error appears in the above-identified patent and that said Letters Patent are hereby corrected as shown below:

Claim 126, line 1, after "claim" and before "wherein" delete "35" and substitute therefor --85--.

Claim 127, line 1, after "claim" and before "wherein" delete "35" and substitute therefor --85--;
line 3, after "signal" and before "and" delete "lever" and substitute therefor --level--.

Signed and Sealed this

Tenth Day of June 1980

[SEAL]

Attest:

SIDNEY A. DIAMOND

Attesting Officer

Commissioner of Patents and Trademarks